(12) United States Patent
Heo

(10) Patent No.: US 6,389,689 B2
(45) Date of Patent: *May 21, 2002

(54) METHOD OF FABRICATING SEMICONDUCTOR PACKAGE

(75) Inventor: Young Wook Heo, Kyungki-do (KR)

(73) Assignee: Amkor Technology, Inc., Chandler, AZ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/024,940

(22) Filed: Feb. 17, 1998

(30) Foreign Application Priority Data

Feb. 26, 1997 (KR) .............................. 97-6063

(51) Int. Cl.[7] .................................. H05K 3/34
(52) U.S. Cl. .................. 29/840; 832/841; 257/778; 257/668
(58) Field of Search ...................... 29/832, 833, 840–2, 29/846; 174/16.3, 52.4; 427/96, 259; 257/723, 778, 697, 698, 691, 693; 438/107, 109, 113, 114

(56) References Cited

U.S. PATENT DOCUMENTS 5,801,446 A * 9/1998 DiStefano et al. .......... 257/778
5,832,600 A * 11/1998 Hashimoto .................. 29/841

FOREIGN PATENT DOCUMENTS

| EP | 0517247 | * | 6/1992 |
| EP | 0692823 | * | 1/1996 |
| EP | 0751561 | * | 1/1997 |
| FR | 2725305 | * | 4/1996 |

* cited by examiner

Primary Examiner—Carl J. Arbes
Assistant Examiner—Sean Smith

(57) ABSTRACT

A method of fabricating a semiconductor package is provided, which realizes a small-size semiconductor package without performance deterioration, to meet a tendency to miniaturization of electronic products in which semiconductor packages are mounted, such as communication apparatus and computer, provides a new type of compact multi-pin semiconductor package as large as a semiconductor chip mounted thereon, and accomplishes a semiconductor package having multi-function to minimize its mounting area on an electronic product, resulting in minimizing of the products.

12 Claims, 6 Drawing Sheets

—PRIOR ART—

—PRIOR ART—

METHOD OF FABRICATING SEMICONDUCTOR PACKAGE

BACKGROUND OF THE INVENTION

1. Field of the Invention

The present invention relates to a method of fabricating a semiconductor package and, more particularly, to a method of fabricating a semiconductor package, which forms the semiconductor package as large as a semiconductor chip to reduce its size and make it compact, and attaches all kinds of semiconductor chips, such as a type in which a bond pad is located at the edge of the surface of semiconductor chip or a type in which the bond pad is formed at the center of the surface of semiconductor chip, in an area array form, to form the input/output ports of the semiconductor package, realizing a high-integration and high-performance semiconductor package.

2. Discussion of Related Art

In general, semiconductor packages include a resin sealed package, TCP package, glass sealed package and metal sealed package. These semiconductor packages are divided into an insertion type and surface mount technology (SMT) type according to the packaging method. A typical insertion type includes a dual in-line package (DIP) and pin grid array (PGA), and typical SMT type includes a quad flat package (QFP), plastic leaded chip carrier (PLCC), ceramic leaded chip carrier (CLCC) and ball grid array (BGA). As electronic products become compact, the SMT-type semiconductor package rather than the insertion type is being widely used in order to increase the packing density of components of a print circuit board.

Conventional QFP and BGA are explained below with reference to FIGS. 1 and 2. FIG. 1 shows a structure of a conventional QFP, constructed of a semiconductor chip 1 in which electronic circuits are integrated, a mounting board 8a to which semiconductor chip 1 is attached by an epoxy 3, a plurality of leads 8 externally transmitting a signal of semiconductor chip 1, a wire 4 connecting semiconductor chip 1 to leads 8, and sealant 5 covering semiconductor chip 1 and other peripheral components to protect them from external oxidation and corrosion. With this QFP, a signal output from semiconductor chip 1 is transmitted to leads 8 through wire 4, to be sent to a peripheral circuit through a mother board connected to leads 8. A signal generated by the peripheral circuit is transmitted to semiconductor chip 1 through a path opposite to the above one. However, as the performance of the semiconductor chip is improved, the number of pins of the QFP increases but the distance between the pins is technically difficult to reduce below a specific size. Thus, allowing the QFP to hold a lot of pins enlarges the package.

To overcome this problem, the BGA package has been proposed, which employs a solder ball fused on one side of semiconductor package as its input/output means. Accordingly, the BGA package can process input/output signals larger than those processed by the QFP and it is fabricated smaller than the QFP. Referring to FIG. 2, the BGA is constructed of a circuit board 2 on which a circuit pattern 2a is formed and a solder mask 2b is coated to protect circuit pattern 2a, a semiconductor chip 1 which includes electronic circuits integrated therein and is attached to the center of the surface of circuit board 2, a wire 4 connecting semiconductor chip 1 to circuit pattern 2a of circuit board 2, to transmit signals, a solder ball 6 fused on circuit pattern 2a of circuit board 2 to externally transmit signals, and a sealant 5 covering semiconductor chip 1 and other peripheral components to protect them from external oxidation and corrosion.

With the BGA constructed as above, a signal output from semiconductor chip 1 is transmitted to circuit pattern 2a through wire 4, and then sent to a mother board through solder ball 6 fused to circuit pattern 2a, to be supplied to a peripheral circuit. A signal generated by the peripheral circuit is transmitted to semiconductor chip 1 through a path opposite to the above one. However, because the BGA package is larger than the semiconductor chip included therein by several times, there is a limit to reduce the size of electronic products employing the package. Furthermore, the circuit board of the BGA package is expensive, increasing the cost of the products. Moreover, moisture may permeate the package through the circuit board, creating cracks.

SUMMARY OF THE INVENTION

Accordingly, the present invention is directed to a method of fabricating a semiconductor package that substantially obviates one or more of the problems due to limitations and disadvantages of the related art.

An object of the present invention is to provide a method of fabricating a semiconductor package, which realizes a small-size semiconductor package without performance deterioration, to meet a tendency to miniaturization of electronic products in which semiconductor packages are mounted, such as communication apparatus and computer, provides a new type of compact multi-pin semiconductor package as large as a semiconductor chip mounted thereon, and accomplishes a semiconductor package having multi-function to minimize its mounting area on an electronic product, resulting in minimizing of the products.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Figure 1:
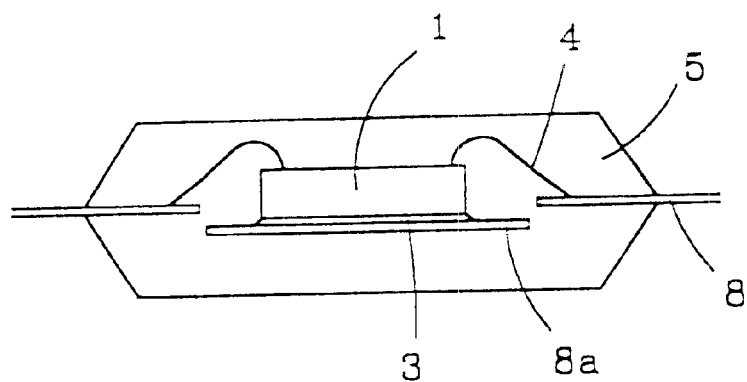
FIGS. 1 and 2 are cross-sectional views showing structures of conventional semiconductor package and BGA package.
Figure 2:
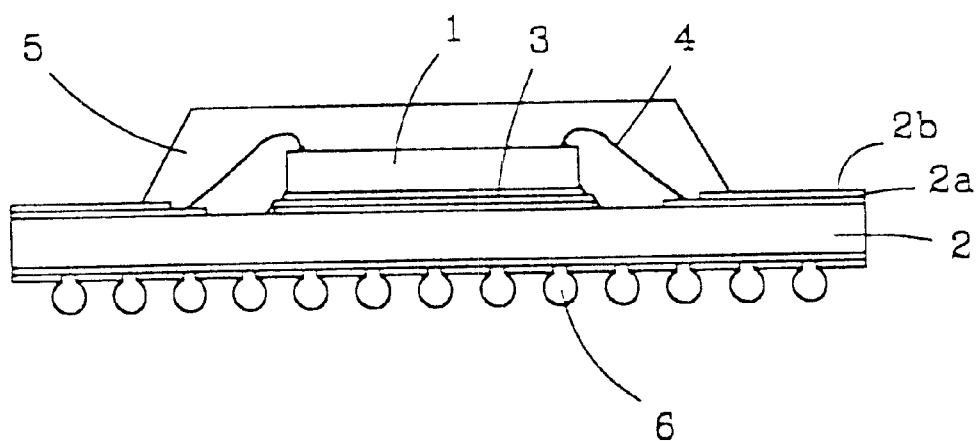

Reference will now be made in detail to the preferred embodiments of the present invention, examples of which are illustrated in the accompanying drawings.

A method of fabricating a semiconductor package according to the present invention, comprises the steps of (a) providing a circuit board sheet 20 constructed in such a manner that a nonconductive material 22 is coated on at least one side of a copper sheet 21, opposite to a side on which a semiconductor chip is mounted, a plurality of repetitive same circuit patterns 23 having a plurality of bond fingers 26 and solder ball lands 25 are formed on nonconductive material 22, at least one rectangular opening 27 is formed in each of circuit patterns 23, and a solder mask 24 covers circuit patterns 23 to protect them, externally exposing bond fingers 26 and solder ball lands 25, bond fingers 26 being arranged on the surfaces of portions of circuit board sheet 20, which lie adjacent to the longer sides of rectangular opening 27; (b) attaching semiconductor chip 10 using adhesive means 30, to expose a bond pad 11 of semiconductor chip 10 through opening 27 formed in each of the plurality of repetitive circuit patterns 23 formed on circuit board sheet 20; (c) electrically connecting bond pad 11 of semiconductor chip 10 to circuit patterns 23 of circuit board sheet 20 with a wire 40; (d) dispensing a sealant 50 and hardening it, to protect bond fingers 26, wire 40 and bond pad 11 of semiconductor chip 10 from external environments; (e) fusing solder balls 60 on solder ball lands 25 formed on circuit board sheet 20 as input/output ports; and (f) cutting circuit board sheet 20 in the same size as that of semiconductor chip 10, dividing it into chip size packages.

Circuit board sheet 20 is fabricated in such a manner that prepreg 22 of a nonconductive material is located on both sides of copper sheet 21, thin copper foil 23a is laminated on prepreg 22 placed on a side where circuit patterns 23 to be formed, circuit pattern 23 is formed in copper foil 23a through exposure and development processes using a dry film for photoresist and a photomask having a circuit pattern thereon, and solder mask 24 is coated to protect circuit pattern 23. Circuit board sheet 20 includes an opening 27 for opening a region where bond pad 11 of semiconductor chip 10 is located.

Figure 3A:
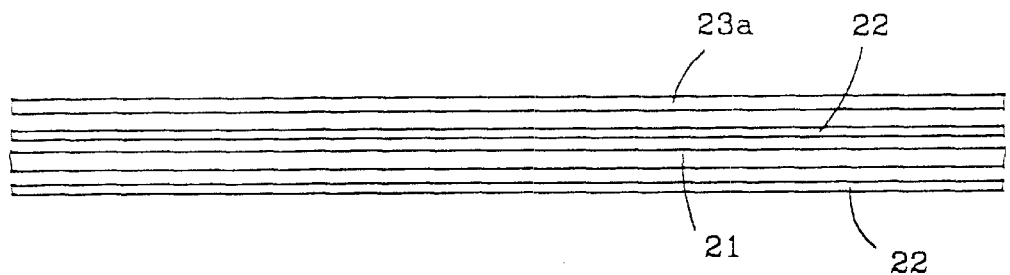
FIGS. 3A to 3G are cross-sectional views showing a method of fabricating a semiconductor package according to the present invention.
Figure 3B:
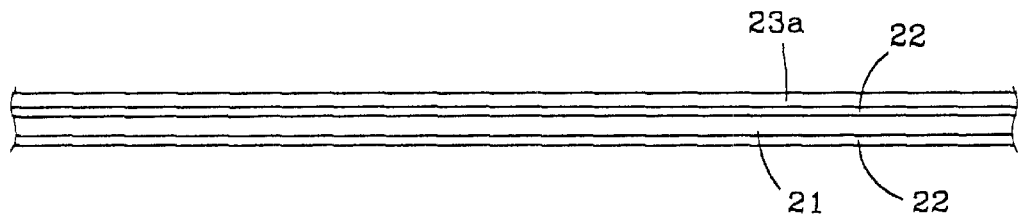
Figure 3C:
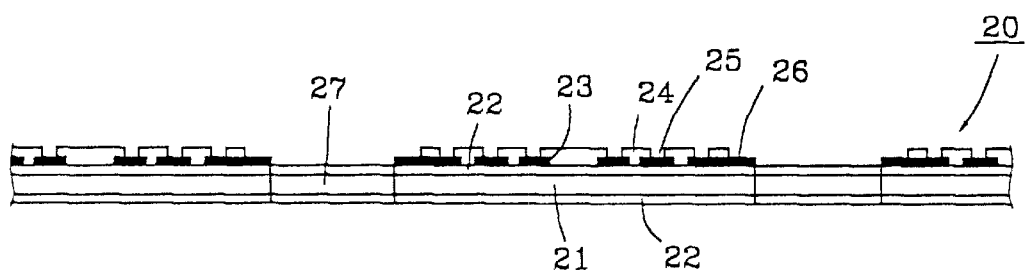

FIGS. 3A to 3G are cross-sectional views illustrating a method of fabricating a semiconductor package according to the present invention. Referring to FIG. 3A showing raw materials for fabricating circuit board sheet 20, prepreg 22 is located on both sides of copper sheet 21, and thin copper foil 23a is laminated on prepreg 22 placed on a side where circuit pattern 23 to be formed. Copper sheet 21 is formed of copper which easily emits heat. FIG. 3B shows the lamination of copper 21, prepreg 22 and copper foil 23a. The lamination uses a lamination press which is able to increase temperature above than 150° C. FIG. 3C shows that circuit pattern 23 is formed in laminated copper foil 23a to fabricate circuit board sheet 20. Referring to FIG. 3C, circuit pattern 23 is formed in such a manner that the dry film for photoresist is attached on copper foil 23a, and exposure and development processes are carried out using the photomask having a circuit pattern thereon, to form a desired circuit pattern. Then, solder mask 24 is coated thereon to protect circuit patterns 23.

Circuit pattern 23 consists of the same patterns repeated in vertical and horizontal directions. Opening 27 is formed in a region where bond pad 11 of semiconductor chip 10 is located. Portions of solder mask 24, through which solder ball 60 will be fused on circuit pattern 23 and bond pad 11 of semiconductor chip 10 will be connected to circuit pattern 23 with wire 40, are opened to form solder ball lands 25 and bond fingers 26. Solder ball lands 25 are arranged in an array form. Portions of circuit pattern 23, exposed through solder ball lands 25 and bond fingers 26, are plated with nickel or gold, to improve bonding strength in case of fusing of solder ball 60 or connection of wire 40.

Figure 3D:
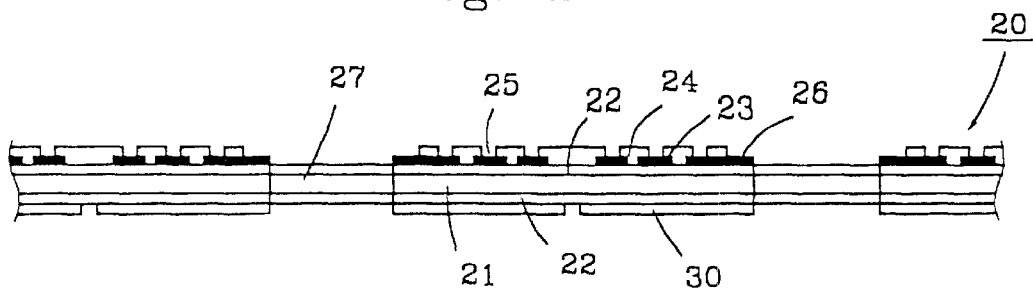
Figure 3E:
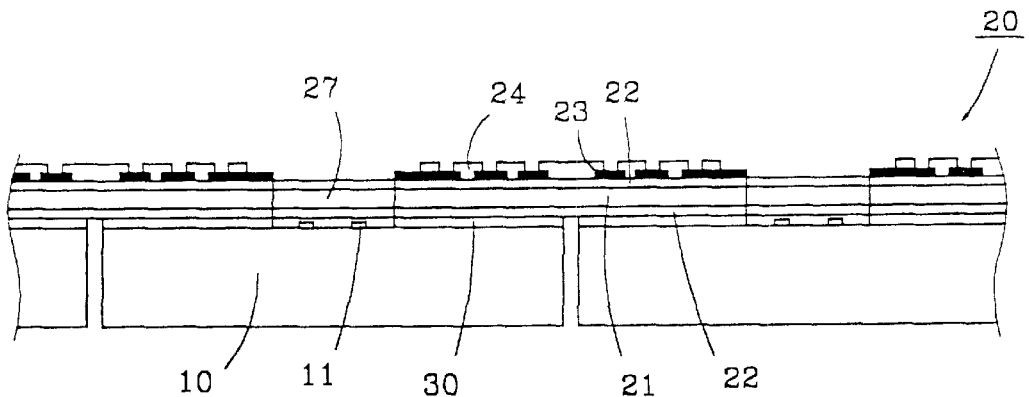

FIG. 3D shows the coating of adhesive means 30 on a side of circuit board sheet 20, opposite to the one on which circuit pattern 23 is formed. Adhesive means 30 are formed in a manner that an epoxy adhesive or adhesive film is coated using a screen printer or dispenser. FIG. 3E shows the adhesion of semiconductor chip 10 on circuit board sheet 20. Referring to FIG. 3E, semiconductor chip 10 is adhered to circuit board sheet 20 on which adhesive means 30, and the epoxy adhesive or adhesive film forming adhesive means 30 is hardened at a high temperature of above 100° C. Here, bond pad 11 of semiconductor chip 10 is exposed through opening 27 of circuit board sheet 20, and each semiconductor chip 10 is attached to each of the same circuit patterns 23 repeated in vertical and horizontal directions. Furthermore, only semiconductor chip 10 judged as a good one by a test which is carried out to semiconductor chips in wafer state is selectively attached to circuit board sheet 20, preventing a poor semiconductor package.

Figure 3F:
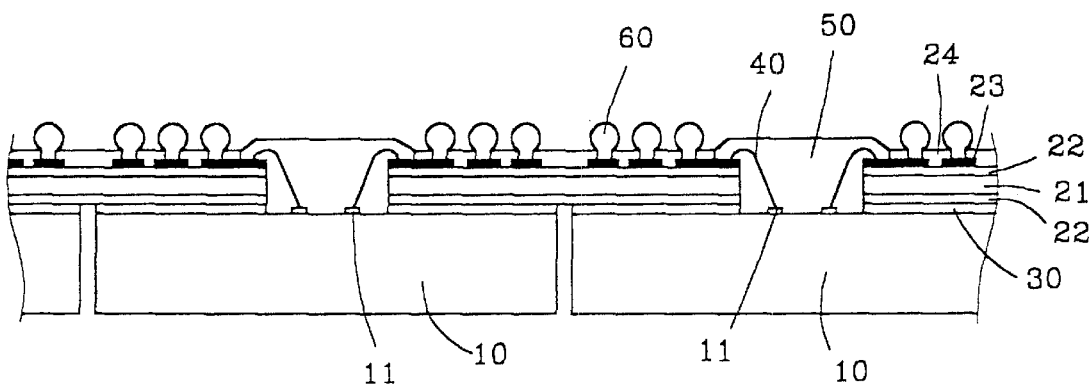

FIG. 3F shows that circuit pattern 23 of circuit board sheet 20 is connected to bond pad 11 of semiconductor chip 10 through wire 40, a sealant 50 covers them, and solder ball 60 is fused on circuit pattern 23. Bond pad 11 of semiconductor chip 10, externally exposed through opening 27 of circuit board sheet 20, and bond finger 26 of circuit pattern 23 are connected with wire 40 using a wire bonder. In this state, a coating liquid, such as epoxy and polyimide, or epoxy type encapsulation material is coated on wire 40 and semiconductor chip 10, and then hardened, to form sealing portion 50, protecting the surfaces of wire 40 and semiconductor chip 10. Then, solder ball 60 is fused on solder ball land 25.

Figure 3G:
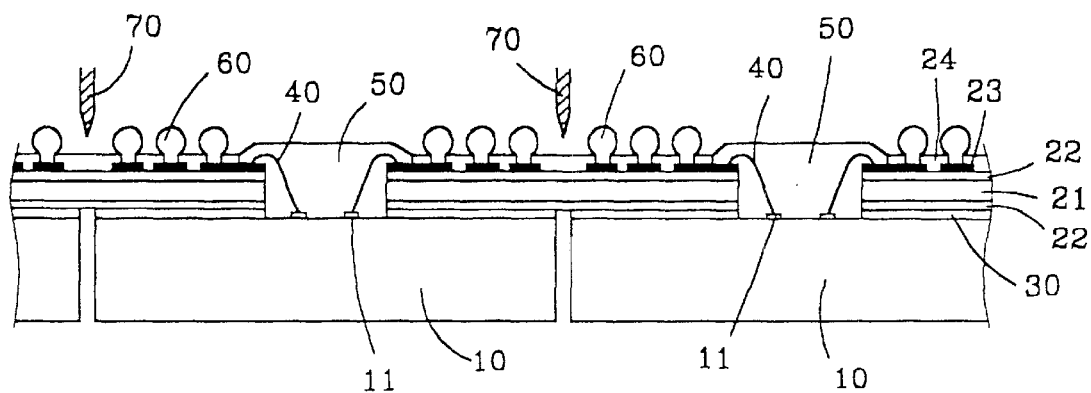

Sealant 50 sealing opening 27 is hardened at an oven or furnace at approximately 150° C. (the fusing point is about 175° C.). To form solder ball 60, first of all, a flux is coated on solder ball land 25, and solder ball 60 is mounted thereon. Thereafter, solder ball 60 undergoes reflow process using an oven or furnace at a high temperature of above 150° C., to be fused on solder ball land 25. After this, a cleaning process is performed to remove unnecessary remnant of the flux. Referring to FIG. 3G showing a step of cutting circuit board sheet 20, circuit board sheet 20 is cut using a sawing apparatus 70, laser or wire cutting apparatus, to divide the same circuit patterns 23 repeated in vertical and horizontal directions into each piece, obtaining the package having the same size as that of semiconductor chip 10.

Figure 4:
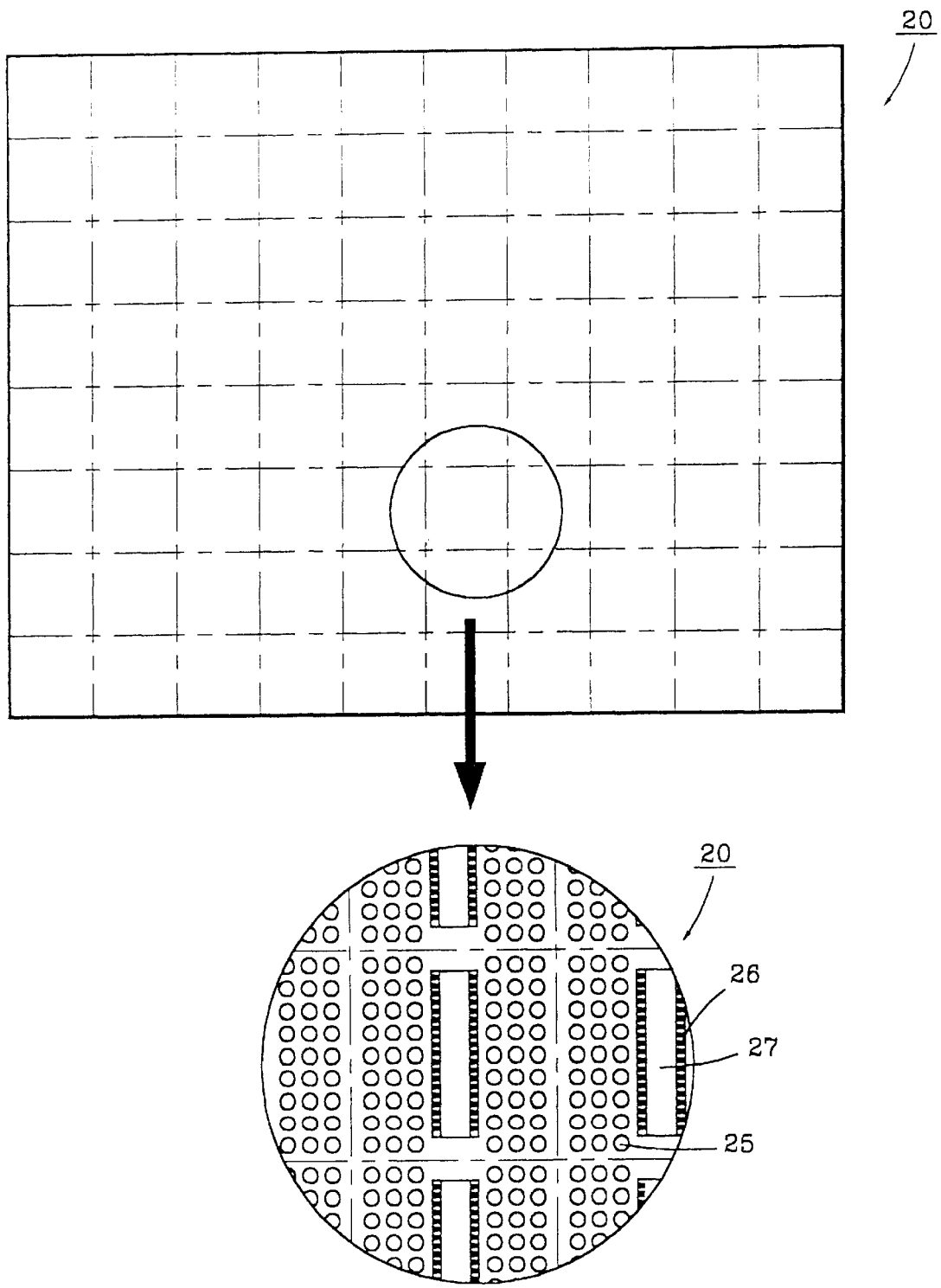
FIG. 4 is a plan view of a circuit board sheet according to an embodiment of the present invention.
Figure 5:
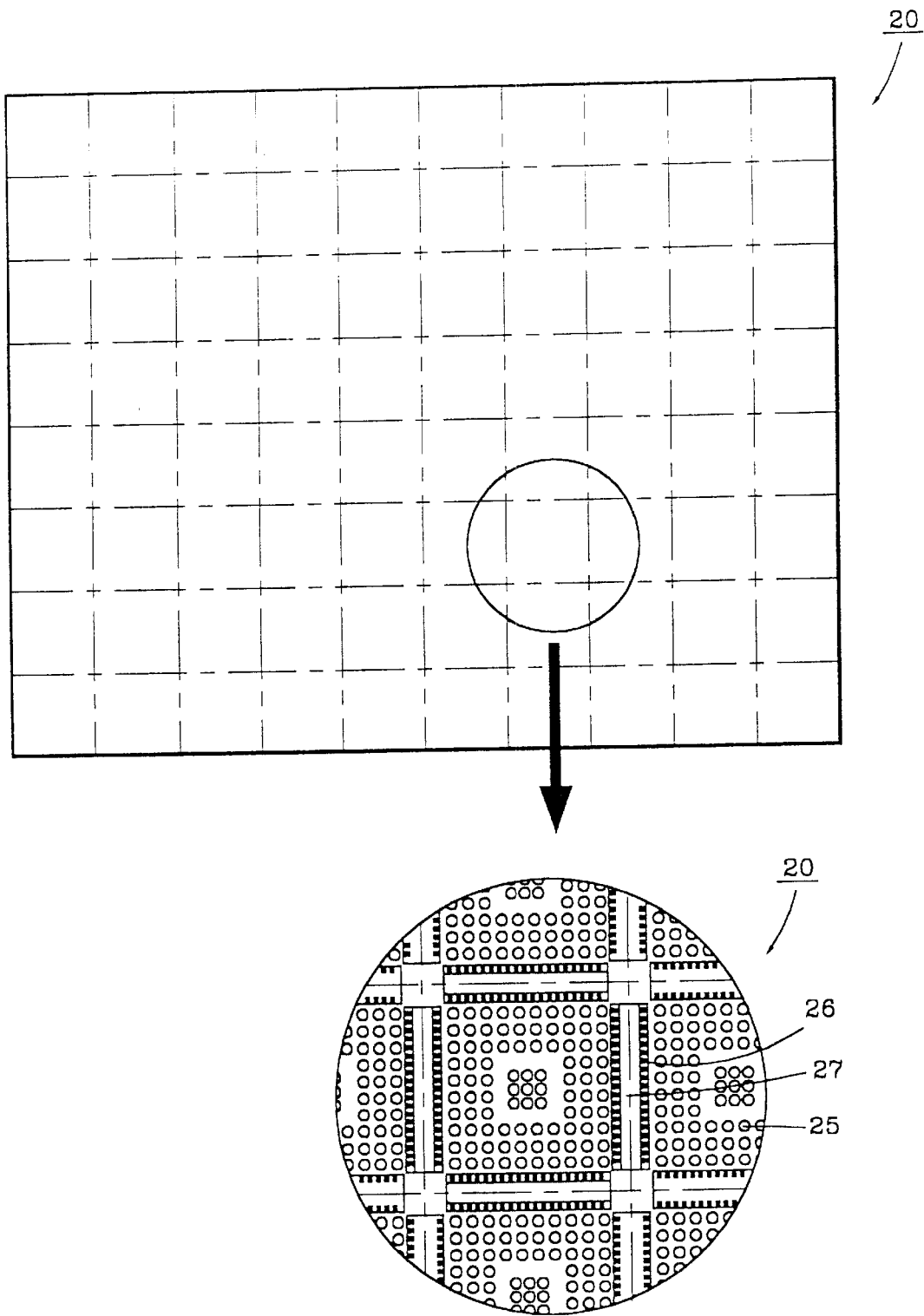
FIG. 5 is a plan view of a circuit board sheet according to another embodiment of the present invention.
Figure 6:
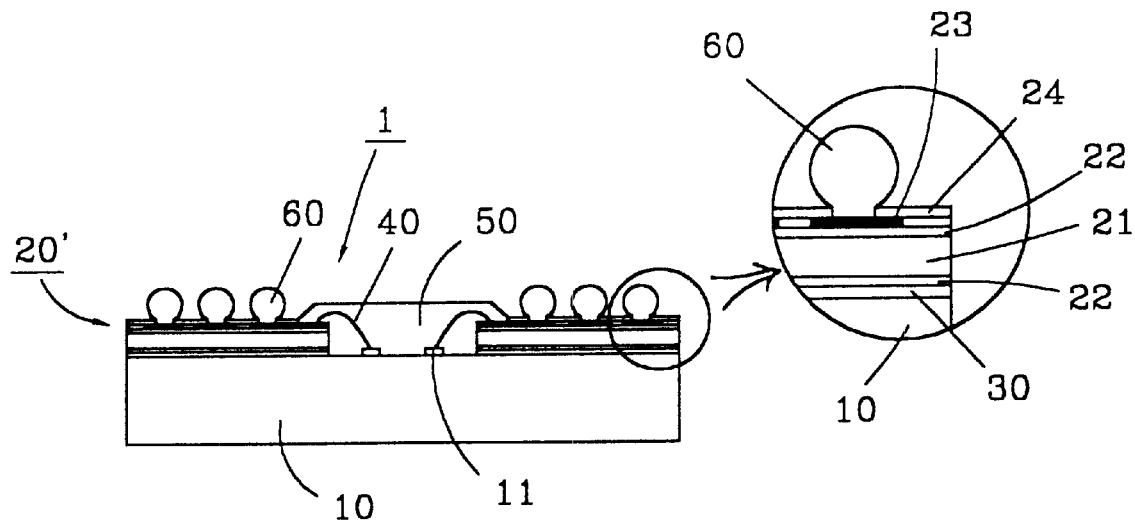
FIG. 6 is a cross-sectional view showing a semiconductor package structure according to an embodiment of the present invention.
Figure 7:
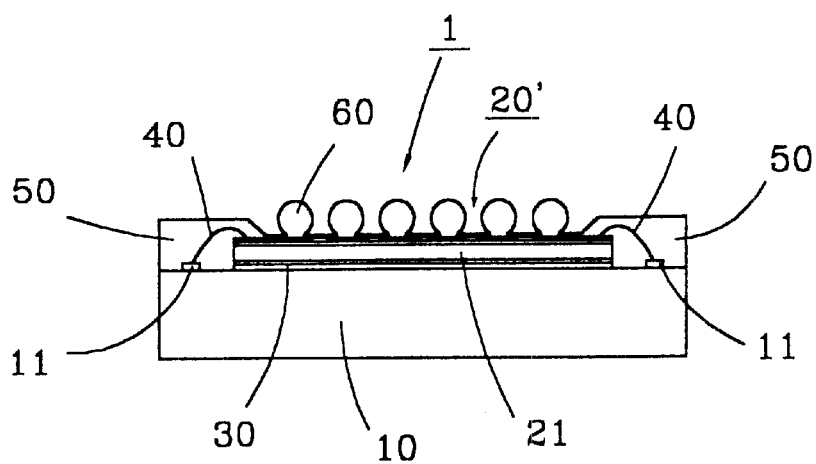
FIG. 7 is a cross-sectional view showing a semiconductor package structure according to another embodiment of the present invention.

FIG. 4 is a plan view showing circuit board sheet 20 in which opening 27 is formed for bond pad 11 formed on semiconductor chip 10 to use a semiconductor chip arranged at the center of the upper surface of semiconductor chip 10. FIG. 5 is a plan view showing circuit board sheet 20 in which opening 27 is formed for bond pad 11 formed on semiconductor chip 10 to use a semiconductor chip arranged at the edge of the upper surface of semiconductor chip 10. FIGS. 6 and 7 are cross-sectional views of the semiconductor package fabricated by the method of the present invention. Referring to FIGS. 6 and 7, the semiconductor package includes: semiconductor chip 10 having electronic circuits integrated thereon, on which bond pad 11 externally transmitting signals from the electronic circuits is formed; an unit circuit board 20' which is attached on a portion of semiconductor chip 10, other than bond pad 11, with adhesive means 30, and includes copper sheet 21, the upper and lower sides of copper sheet 21 being coated with a nonconductive material, circuit pattern 23 being formed on the upper side; wire 40 for transmitting a signal between bond pad 11 of semiconductor chip 10 and circuit pattern 23; sealant 50 covering the wire bonded area to protect it from external oxidation and corrosion; and solder ball 60 fused on circuit pattern 23, to externally transmit a signal of semiconductor chip 10 sent through wire 40.

Bond pad 11 formed on semiconductor chip 10 may be arranged at the center of the upper surface of semiconductor chip 10, as shown in FIG. 6. Otherwise, as shown in FIG. 7, bond pad 11 may be arranged at the edges of the upper surface of semiconductor chip 10. The semiconductor package of the present invention is a chip size package which has the same size as that of semiconductor chip 10. With this package, a signal output from semiconductor chip 10 is transmitted to circuit pattern 23 through wire 40, and then supplied to a mother board through solder ball 60 fused on circuit pattern 23, to be sent to a peripheral device. A signal generated by the peripheral device is transmitted to semiconductor chip 10 through a transmission path opposite to the above one.

According to the present invention, only semiconductor chips judged as good ones by a test which is carried out to semiconductor chips in wafer state are selectively attached to the circuit board sheet, to fabricate the semiconductor package, thereby preventing the generation of poor semiconductor chip and realizing a compact multi-pin semiconductor package.

It will be apparent to those skilled in the art that various modifications and variations can be made in the method of fabricating a semiconductor package of the present invention without departing from the spirit or scope of the invention. Thus, it is intended that the present invention cover the modifications and variations of this invention provided they come within the scope of the appended claims and their equivalents.

What is claimed is:

1. A method of making a plurality of semiconductor packages, the method comprising:
    providing a substrate comprising a metal core layer having first and second insulative layers respectively laminated on opposing surfaces of the metal core layer, a plurality of sets of circuit patterns on the first insulative layer opposite the metal core layer, and a plurality of apertures through the substrate, wherein each aperture is associated with at least one of the sets of circuit patterns, and the circuit patterns of each set each include a first end proximate to one of the apertures and an opposite second end;
    providing plurality of semiconductor chips each having a first surface with a plurality of bond pads thereon;
    attaching the first surface of each semiconductor chip to the second insulative layer opposite the metal core layer using an adhesive layer so that each semiconductor chip is opposite one of the sets of circuit patterns and each bond pad is superimposed by one of the apertures;
    electrically connecting the bond pads of each chip to the first ends of the respective opposing circuit patterns through the respective superimposed aperture;
    applying an encapsulant material into each aperture so as to cover the superimposed bond pads;
    fusing solder balls to the second ends of the circuit patterns of each set of circuit patterns; and
    severing the substrate around each semiconductor chip so as to singulate a plurality of the packages.

2. The method of claim 1, wherein at least one said aperture is at a center of the associated set of circuit patterns, and the bond pads superimposed by said aperture are centrally between opposing peripheral edges of the first surface of the semiconductor chip.

3. The method of claim 1, wherein at least two said apertures are associated with each set of circuit patterns, and the bond pads superimposed by each of said apertures are proximate to a peripheral edge of the first surface of the semiconductor chip.

4. The method of claim 1, wherein at least some of the apertures are shared between at least two adjacent sets of circuit patterns, and the substrate and encapsulant are severed through the shared apertures after encapsulation.

5. The method of claim 1, wherein electrically connecting the bond pads of each chip to the first ends of the respective opposing circuit patterns includes connecting a bond wire between each bond pad and one of said first ends.

6. A method of making a semiconductor package, the method comprising:
    providing a substrate comprising a metal core layer having a first surface and an opposite second surface, an insulative first layer on the first surface of the metal core layer, an insulative second layer on the second surface of the metal core layer, and a set of circuit patterns on the first layer opposite the metal core layer, wherein the substrate includes a central slot aperture through the substrate;
    providing a semiconductor chip having a first surface with a plurality of bond pads thereon, said bond pads located at a center portion of the first surface;
    attaching the first surface of the semiconductor chip to the insulative second layer of the substrate with an adhesive so that the bond pads face the central slot aperture;
    electrically connecting the bond pads to respective ones of the circuit patterns through the central slot aperture; and
    covering the bond pads and filling the aperture with an insulative encapsulant meterial.

7. The method of claim 6, wherein electrically connecting the at least some bond pads to respective ones of the circuit patterns comprises connecting a bond wire between the respective bond pad and the respective circuit pattern.

8. The method of claim 6, further comprising forming a plurality of solder input/output terminals, each fused to a respective one of the circuit patterns.

9. A method of making a semiconductor package, the method comprising:
    providing a substrate comprising a metal core layer having a first surface and an opposite second surface, an insulative first layer on the first surface of the metal core layer, an insulative second layer on the second surface of the metal core layer, and a set of circuit patterns on the first layer opposite the metal core layer, wherein the substrate has a perimeter;
    providing a semiconductor chip having a first surface with a central portion and a peripheral portion, wherein a plurality of bond pads are located at the peripheral portion of the first surface;

attaching the central portion first surface of the semiconductor chip to the insulative second layer of the substrate with an adhesive so that the bond pads of the peripheral portion of the substrate overhang the perimeter of the substrate;

providing a plurality of metal conductors, and electrically connecting each conductor between a respective one of the bond pads and a respective one of the circuit patterns; and covering the bond pads, the metal conductors, and only a sub-portion of the first insulative layer of the substrate with an encapsulant material.

10. The method of claim 9, further comprising providing an orthogonal side wall on said encapsulant material coincident with the perimeter of the substrate.

11. The method of claim 9, wherein electrically connecting the at least some bonds pads to respective ones of the circuit patterns comprises connecting a bond wire between the respective bond pad and the respective circuit pattern.

12. The method of claim 9, further comprising forming a plurality of solder input/output terminals each fused to a respective one of the circuit patterns.

* * * * *